United States Patent [19]

Kukanskis et al.

[11] Patent Number: 5,077,099
[45] Date of Patent: Dec. 31, 1991

[54] ELECTROLESS COPPER PLATING PROCESS AND APPARATUS

[75] Inventors: Peter E. Kukanskis, Woodbury; Edward T. Donlon, Bethlehem, both of Conn.

[73] Assignee: MacDermid, Incorporated, Waterbury, Conn.

[21] Appl. No.: 493,296

[22] Filed: Mar. 14, 1990

[51] Int. Cl.$^5$ .............................................. C23C 26/00
[52] U.S. Cl. ................................... 427/437; 427/438; 427/443.1; 427/347; 427/57; 118/425
[58] Field of Search ..................... 427/437, 438, 443.1, 427/347, 57; 118/425

[56] References Cited

U.S. PATENT DOCUMENTS

| | | | |
|---|---|---|---|
| 3,011,920 | 2/1961 | Shipley, Jr. | 117/213 |
| 3,577,324 | 5/1971 | Patterson | 204/20 |
| 3,615,735 | 10/1971 | Shipley, Jr. | 106/1 |
| 3,667,590 | 6/1972 | Mead | 118/425 |
| 3,934,054 | 1/1976 | Schmeling | 427/8 |
| 4,059,710 | 11/1977 | Nishiyama | 427/304 |
| 4,209,331 | 6/1980 | Kukanskis et al. | 106/1.23 |
| 4,228,213 | 6/1980 | Beckenbaugh et al. | 428/209 |
| 4,279,948 | 1/1981 | Kukanskis et al. | 427/305 |
| 4,597,988 | 1/1986 | Kukanskis et al. | 427/97 |
| 4,608,275 | 8/1986 | Kukanskis et al. | 427/98 |
| 4,695,505 | 9/1987 | Dutkewych | 428/209 |
| 4,734,296 | 3/1988 | Schramm | 427/443.1 |
| 4,756,930 | 7/1988 | Kukanskis et al. | 427/97 |

FOREIGN PATENT DOCUMENTS

| | | | |
|---|---|---|---|
| 67674 | 4/1985 | Japan | 427/443.1 |
| 2-23697 | 1/1990 | Japan | |
| 8401392 | 4/1984 | PCT Int'l Appl. | 427/437 |

OTHER PUBLICATIONS

Doubrava, Jeffrey J. "The 'Black Hole' and Beyond: The Production of Void-Free Plated Through Holes", Aug. 1985 pp. 14-29, PC FAB.
D'Ambrisis, Joseph J., et al., "The Chemistry of Plating Small Diameter Holes—Part I", Apr. 1989, PC FAB.
D'Ambrisi, Joseph J., et al., "The Chemistry of Plating Small Diameter Holes—Part II", Aug. 1989, PC FAB.
Kukanskis, Peter E., "Improved Smear Removal", Mar. 1983, Printed Circuits.
Electronic Chemicals News (Approx. Jan. 1989).

*Primary Examiner*—Shrive Beck
*Assistant Examiner*—Vi Duong Dang
*Attorney, Agent, or Firm*—St.Onge Steward Johnston & Reens

[57] ABSTRACT

An electroless metal plating process, particularly for use in plating through-holes in printed circuit substrates, and more particularly for additively depositing copper metal on through-hole surfaces, in which the substrate is at least intermittently subjected to vibrating motion in contact with the electroless depositing bath, and an electroless metal depositing apparatus for carrying out the process.

12 Claims, 2 Drawing Sheets

ELECTROLESS COPPER PLATING PROCESS AND APPARATUS

BACKGROUND OF THE INVENTION

The present invention relates principally to the electroless deposition of copper onto the suitably activated surfaces of a substrate, more particularly to the electroless deposition of copper onto the suitably activated through-hole surfaces of a printed circuit board substrate having through-holes, and still more particularly to process of this type where the through-holes have a high aspect ratio.

The electroless deposition of copper (here used to include copper alloys or intermetallics), i.e., the chemical plating of copper onto a catalytically activated substrate surface by chemical reduction without need for externally-applied electrical current, is a well-known process in extensive commercial use, particularly in the manufacture of printed circuit boards. Generally speaking, electroless copper depositing solutions (baths) are aqueous solutions containing a bath-soluble source of copper, a reducing agent for the copper ion, a complexing agent for the copper, and a source, if necessary, of acid or alkali to achieve the pH at which the bath is intended to operate. Typical baths are based upon formaldehyde (or a precursor thereof) as the reducing agent, but more recently baths have become available based upon hypophosphite reducing agents. See, e.g., U.S. Pat. Nos. 4,209,331 and 4,279,948 to Kukanskis, et al.

The substrate surfaces to be electrolessly copper plated are clean, catalytically active surfaces. Typically, the catalytic activation is by means of palladium/tin sols or solutions (see, e.g., U.S. Pat. Nos. 3,011,920 and 3,532,518) which often require an acceleration step to expose and/or activate the catalytic species. See, e.g., U.S. Pat. No. 4,608,275 to Kukanskis.

Generally speaking, the electroless copper plating process is carried out by immersion of the substrate into a tank containing the electroless bath. For the planar substrates typically employed in printed circuit manufacture, a number of such substrates generally are treated at one time, for example by racking them vertically in parallel in a suitable racking device which can then be serially immersed into tanks containing cleaning solutions, catalyst, accelerators, rinse tanks, and ultimately into a tank holding the plating bath. It is not uncommon to mechanically move the rack holding the substrates in a relatively slow back and forth motion perpendicular to the vertical disposition of the substrates in the bath as a means for improving plating uniformity over the substrate surface.

Among the most important uses of electroless copper plating is in the provision of the requisite conductive metal surface in the through-holes which are provided in double-sided and multilayer printed circuits and through which conductive interconnection is achieved between or among circuit patterns on the opposed substrate and/or innerlayer surfaces. The integrity of the conductive metal layer provided on these through-hole surfaces, in terms of its full coverage, adherence, and resistance to cracking or peeling under stress (particularly as will occur when components are later soldered to the printed circuit), is of decisive importance in achieving useful printed circuit boards. To this end, significant attention has been devoted to the preparation of the non-conductive through-hole surfaces for receipt of electroless metal, including steps for cleaning and desmearing the hole surfaces, altering their topography, conditioning them for adherent receipt of catalyst, and the like. See generally, Kukanskis, P., "Improved Smear Removal", Circuit Manufacturing, pp. 573-74 (March 1983); Kukanskis, P., "Improved Smear Removal Process For Multilayer Circuit Boards", IPC Technical Paper No. 435 (October 1982); U.S. Pat. Nos. 4,597,988 and 4,756,930 to Kukanskis, et al.; and Doubrava, J.J., "The 'Black Hole' and Beyond: The Production Of Void-Free Plated Through Holes", PC Fab., August 1985. Work also has been devoted to particular formulations of electroless copper plating baths to provide deposits which are less resistant to stress and cracking. See U.S. Pat. Nos. 3,615,735; 4,228,213; and 4,695,505.

The integrity of the electrolessly deposited copper layer on through-hole surfaces is particularly important in so-called "additive" or "full build" printed circuit manufacturing processes in which electroless deposition provides the full extent of metallization in the through-holes (i.e., as opposed to processes in which only a thin electroless plate is provided which is then overplated with electrolytic copper).

For substrates having through-holes which have an aspect ratio ratio of substrate thickness to hole diameter) on the order, say, of 3:1, the conventionally-employed electroless plating techniques, e.g., involving slow mechanical back and forth movement of the racked substrates (in a direction normal to the vertical disposition of the substrates and, hence, parallel to the through-hole bore) have proven generally satisfactory for achieving good through-hole plating (providing, of course, that adequate hole preparation steps have been employed). Current design criteria for printed circuit boards, involving space-saving increased interconnect capability, have brought about multilayer boards having numerous innerlayer circuit patterns (thereby increasing the thickness of the board) while at the same time having numerous small diameter through-holes. Thus, aspect ratios ranging as high as 20:1 are encountered, and it has been found that this makes conventional electroless plating techniques increasingly less able to provide plated through-holes in which the electroless deposit possesses the necessary integrity. See generally, D'Ambrisi, J. J., et al., "The Chemistry Of Plating Small Diameter Holes—Part I", PC Fab, April 1989, and D'Ambrisi, J. J., et al., "The Chemistry Of Plating Small Diameter Holes—Part II," PC Fab, August 1989.

As is described hereinafter, our efforts initially directed to improved electroless plating of high aspect ratio through-holes have also led to significant and surprising findings applicable generally to electroless plating, including electroless plating of low aspect ratio through-holes heretofore considered satisfactorily plated using conventional techniques.

SUMMARY OF THE INVENTION

In accordance with the present invention, it has been found that the functional properties of an electrolessly deposited copper layer on an activated substrate surface, particularly the surfaces of high aspect ratio through-holes, is substantially improved by the expedient of at least intermittently subjecting the substrate to vibration while immersed in the electroless plating bath. The nature of the improvement, in comparison to a substrate identically processed but without the vibration of the invention, is to provide essentially stress-free electroless copper deposits having excellent coverage and adherence to the substrate surface and which maintain integrity (e.g., resistance to cracking, etc.) even under numerous and extreme temperature cyclings. The present invention is accordingly of significant importance in the electroless plating of through-holes in printed circuit boards, particularly through-holes having high aspect ratios, and still more particularly for such throughholes which are plated in an additive or full build printed circuit board fabrication process.

As will be readily appreciated, the vibrating to which the activated substrate surfaces are subjected is significantly different from the conventional relatively slow back and forth motion of the substrates in the bath as is achieved by mechanical movement of the rack on which the substrates are vertically disposed in the bath. Rather, the vibrating is characterized by very rapid oscillations of the substrate in the bath, which oscillations have extremely short amplitudes, almost imperceptible to the naked eye. Depending upon the means employed to achieve the requisite vibrating, the oscillations can be either entirely in a direction normal to the generally vertical disposition of the substrate in the bath (and, hence, for through-hole-containing substrates, parallel to the through-hole bore), i.e., back and forth, or entirely in a direction parallel to the substrate disposition in the bath (i.e., up and down), or, as is more often the case, generally imposed oscillations having components in both such directions. Generally, the oscillation (vibration) rate is very rapid, i.e., at least about 500 vibrations per minute, more preferably at least about 2000 vibrations per minutes, and most preferably at least about 3500 vibrations per minute. The upper limit on the oscillation rate is essentially a functional one, i.e., the oscillations should not be of so high a frequency as to bring about excessive agitation of the bath and, most importantly, not so high as to bring about degassing, which in turn permits air bubbles to be more readily desorbed from the plating bath, a phenomenon which generally is encountered as ultrasonic frequencies are approached, and which leads to destabilization of the bath. In terms of the amplitude of the vibrations, whether measured in directions normal to or parallel to the substrate surface, they generally will be on the order of less than about 2 cm. As previously noted, however, the typical amplitudes associated with the rapid oscillations are extremely small and nearly imperceptible to the naked eye.

The foregoing parameters also serve to distinguish the vibrating of the present invention from a practice in the prior art employing a mechanical "thumper", i.e., an air-driven piston positioned next to the flight bar of the rack holding the substrates immersed in the electroless plating bath, which is activated at periodic intervals to provide a mechanical jarring to the flight bar, rack and substrate as a means for loosening air bubbles entrapped in through-holes.

The vibrating of the substrate in contact with the electroless plating bath can be, and preferably is, employed in conjunction with the known gross mechanical back and forth movement of the substrate as achieved, e.g., by mechanical movement of the racking device which holds the substrate(s).

As noted, the substrate is subjected to at least intermittent vibrating in the electroless copper plating bath. Preferably, the vibrating is imposed at fairly regular cycles throughout the electroless plating process, i.e., a period of vibration, followed by a period of absence of vibration, followed by a period of vibration, etc. Generally, the time for which the substrate is subjected to vibrating in order to achieve the benefits of the invention is a function of the vibration rate and of the dimensional properties of the substrate, e.g., whether the substrate contains through-holes and the aspect ratio of those through-holes. The overall extent of vibrating can be readily determined by routine experimentation based upon desired final result. By way of example, in an additive process for applying 1.4 mils of electroless copper onto surfaces of through-holes having an aspect ratio of 16:1 (a process which may require immersion of the substrate in the electroless bath for twenty (20) hours), a vibrating cycle of 60 seconds on, 120 seconds off, etc., using a vibrating apparatus affixed to the flight bar of the racking device and operating at a nominal vibration rate of about 3600 vibrations per minute, is sufficient to provide an electroless copper deposit having excellent coverage, adherence and integrity, and which does not evidence cracking even after repeated extreme temperature cycling in either molten solder or hot oil.

The means by which the substrate immersed in the electroless plating bath is subjected to vibration can be selected from any convenient means, utilizing known and available vibratory devices capable of operating at vibration rates sufficient to bring about the desired results as set forth herein. Typically, and preferably, the vibratory device is one which is capable of being applied or attached to the racks conventionally employed to hold one or more substrates and immerse them into the electroless plating bath, or to particular apparatus associated with the racks (e.g., flight bar or other device supporting the rack in the electroless plating vessel). The vibratory motion is transmitted to the rack and in turn to the substrates held by the racks. It is also possible, however, to utilize vibratory devices which are affixed directly to the substrates immersed in the bath or which bring about the required vibrating of the substrate in other indirect manner.

The present invention also provides an apparatus for electroless plating, comprising a vessel for holding an electroless plating bath, means for holding one or more substrates in a generally parallel vertical disposition within the vessel for immersion in the electroless bath therein, and means for imparting vibrating motion to the substrates immersed in the electroless plating bath, the means preferably being directly or indirectly associated with the substrate holding means.

DETAILED DESCRIPTION OF THE INVENTION

The present invention is particularly applicable to the electroless plating of copper (again, used here to include copper metal, copper alloys or copper intermetallic) on any suitably activated substrate surface, including substrates composed of thermoplastic or thermosetting materials, glass, ceramics, and the like. The invention is particularly applicable, as noted, to electroless plating employed in the fabrication of printed circuit boards, where the substrates commonly encountered are based upon epoxy or polyimide, particularly glass-reinforced versions thereof. The invention is primarily applicable to the electroless plating of activated through-hole surfaces in double-sided or multilayer printed circuit boards. As noted, the invention has particular applicability to the electroless plating of through-holes having high aspect ratios, e.g., greater than 3:1 and generally greater than 8:1, but also has been found to bring about substantial improvement in the plating of low aspect ratio through-holes (e.g., 3:1 and less) which heretofore have been considered satisfactorily processable using conventional electroless plating techniques.

The surfaces to be electrolessly plated with copper will be treated in conventional manner to clean the surfaces and provide thereon species which catalyze the electroless deposition, all as previously noted. For through-holes, particularly those in multilayer circuit board substrates, the hole surfaces will be subjected to conventional surface preparation steps for desmearing and/or etchback, conditioning, and the like, preparatory to catalytic activation and electroless plating.

The electroless plating baths can be any of the known baths for electroless deposition of copper, including formaldehyde-reduced baths, and hypophosphite-reduced baths. As is known in the art, many hypophosphite-reduced copper plating baths are generally non-autocatalytic and, thus, cannot alone produce the plating thicknesses necessary in full-build applications (e.g., greater than 1.0 mil). Thus, in the preferred full-build applications, either formaldehyde-reduced electroless copper plating baths will be employed or hypophosphite-reduced baths which have been modified, or are used in a manner, which renders them autocatalytic and hence capable of attaining the requisite plating thicknesses. See, e.g., U.S. Pat. No. 4,265,943 to Goldstein, et al.; U.S. Pat. No. 4,459,184 to Kukanskis; and U.S. Pat. No. 4,671,968 to Slominski. Where full-build thicknesses are not required, use can be made of the non-autocatalytic hypophosphite-reduced copper baths as disclosed in Kukanskis, et al. U.S. Pat. Nos. 4,209,331 and 4,279,948.

Figure 1:
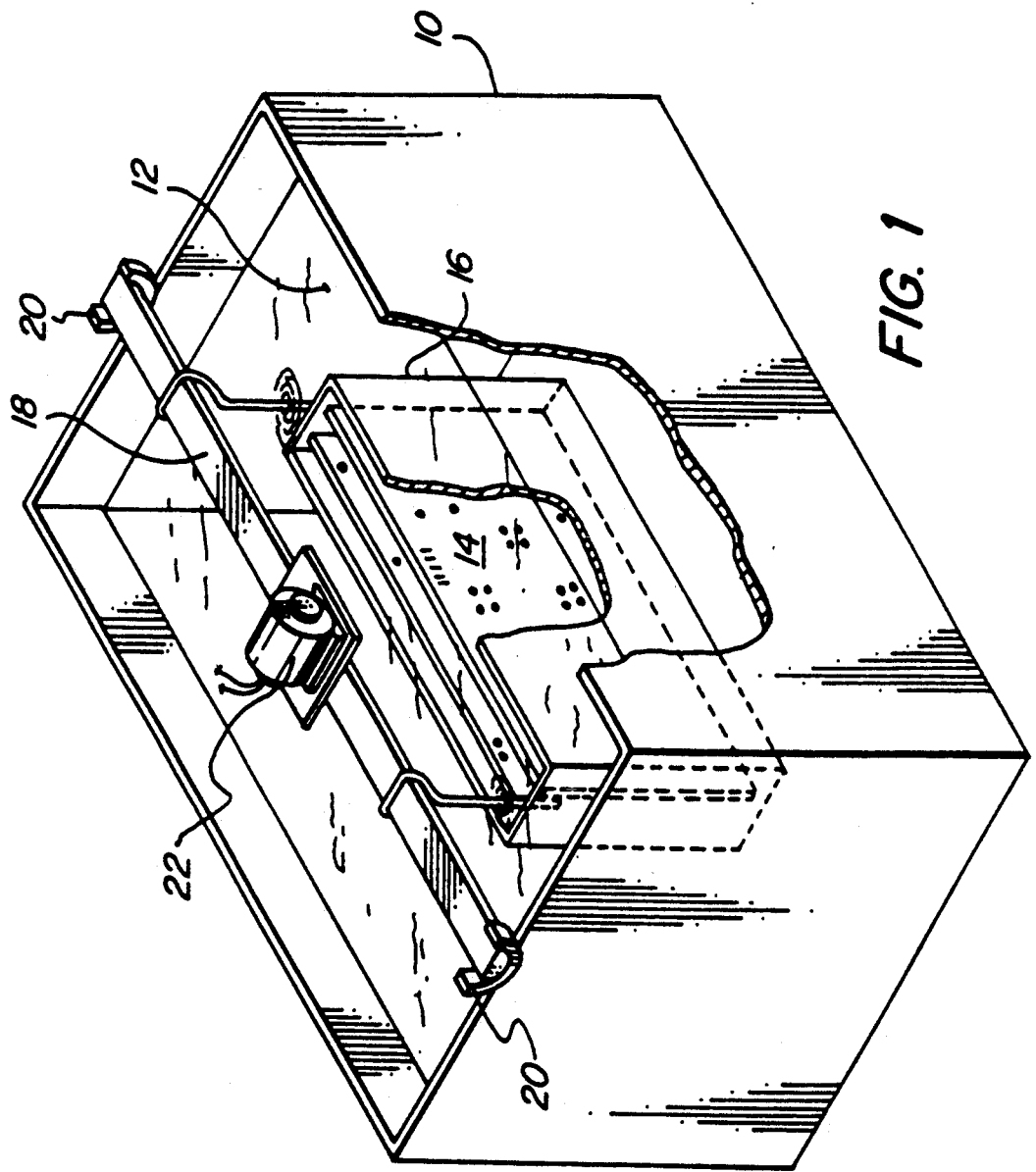
FIG. 1 is a schematic perspective illustration of an electroless plating vessel having substrates, held in a rack, immersed in an electroless plating bath in the vessel, and in which a vibratory device is affixed to the flight bar on which the rack is suspended.
Figure 2:
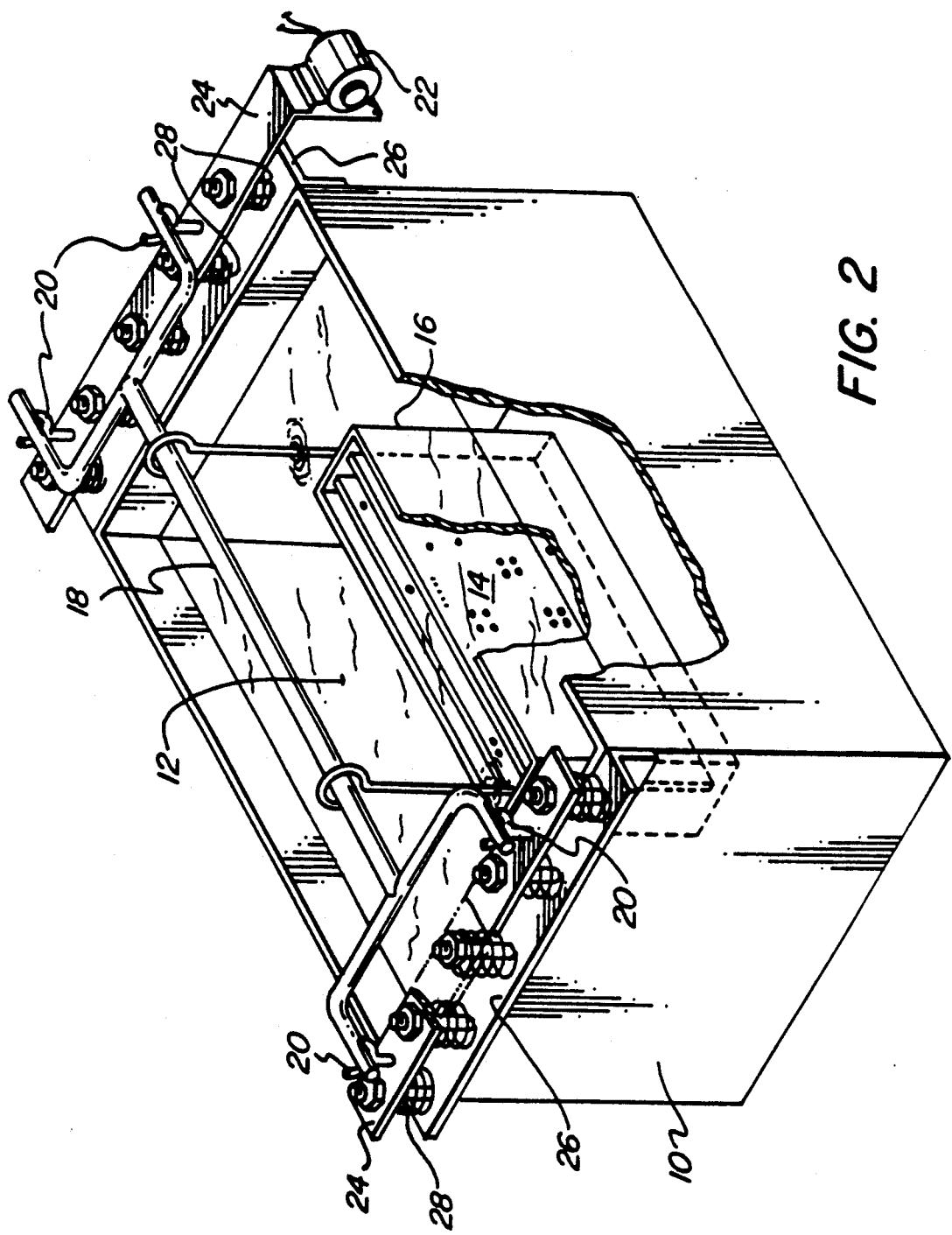
FIG. 2 is a schematic perspective illustration of an electroless plating vessel having substrates, held in a rack, immersed in an electroless plating bath in the vessel, and in which a vibratory device is affixed to a support bar on which rests a carrier bar on which the rack is arranged.

As set forth in FIG. 1 and FIG. 2, a typical electroless plating vessel or tank 10 is used to house the electroless plating bath 12, and typically will have means associated therewith for agitating the plating bath, recirculating overflow bath, and maintaining the bath at suitable operating temperature, typically in excess of about 120° F. and more typically in the range of from about 130° F. to 150° F.

Through-hole containing substrates 14 are suspended in the electroless plating bath from racking device 16 which holds the substrates in parallel and in generally vertical orientation in the electroless bath.

In the embodiment of FIG. 1, the racking device 16 is suspended from a flight bar 18 which extends across the plating vessel 10 and rests on the upper walls of the vessel, most preferably resting on saddles 20 affixed to the tank walls.

According to this embodiment of the invention, vibratory device 22 is affixed to the flight bar 18, e.g., magnetically or otherwise, and is in turn connected to an electrical source (not shown) for driving the vibratory device. The vibratory device affixed to the flight bar transmits vibrations to the rack and in turn to the substrates held in the rack, causing them to vibrate in contact with the plating bath. As noted, the vibratory device typically will be operated at generally regular on-off periods during the electroless depositing process so as to at least intermittently subject the substrates to the vibrating necessary to produce electroless deposits of improved overall integrity, particularly resistance to cracking.

In the embodiment of FIG. 2, the racking device 16 also is suspended into the plating vessel from a flight or carrier bar 18. In this embodiment, support bars 24, having saddles 20 affixed thereto, are affixed to rims or flanges 26 associated with the plating tank walls. The carrier bar 18 is arranged to rest on the saddles 20 of these support bars 24, and vibratory device 22 is affixed to at least one of the support bars. Preferably, the support bars 24 and/or the tank rims 26 include coil springs 28 which are put into compression when the support bar is affixed to the tank rim. The vibratory device 22 transmits vibrations to the support bar 24, in turn to carrier bar 18, in turn to racking device 16, and in turn to the substrates 14 held in the racking device.

The invention is illustrated further in the following examples.

EXAMPLE I

A multilayer epoxy-glass circuit board having a board thickness of 125 mils and through-holes 8 mils in diameter (i.e., aspect ratio of about 16:1) was prepared for additive electroless plating by subjecting the board and through-holes to steps of solvent conditioning, permanganate desmear, conditioning, activation and acceleration. The so-prepared substrate, held in a conventional rack suspended from a flight bar, was immersed in vertical orientation in an electroless copper plating ion), complexing agent (0.1 Molar), formaldehyde (2.0 g/l), caustic (3.0 g/l) and stabilizers (5.0 ppm), and operated at 140° F. for 20 hours to achieve a plating thickness of 1.4 mils.

A vibrator (Martin Micro Motomagnetic ® Electric Vibrator (3600 RPM, 115 volt, 60 Hz), Martin Engineering Company, Neoponset, Ill.) was attached to the flight bar (configuration as in FIG. 1), and during the 20-hour plating process was operated at 60 seconds on, 120 seconds off.

During this time, the rack also was subjected to slow mechanical back and forth movement at a rate of 2 feet per minute.

After plating, the board was dried and baked for 4 to 6 hours at 300° F., and sections of the board were then tested as follows. The plated through-holes were floated on molten solder at 500° F. for 10 seconds, allowed to cool to room temperature, and then reimmersed in the molten solder, a sequence repeated five times. Other throughholes were immersed in hot oil at 550° F. for 20 seconds, allowed to cool in room temperature oil for 2 minutes, and then reimmersed in the hot oil, a sequence repeated 20 times. The so-treated through-holes were then cross-sectioned and examined under a microscope, with no evidence of cracking of the plated deposit found.

EXAMPLE II

Example I was repeated in all respects but without the use of the vibratory device, resulting in a 1.2 mil plate after 20 hours. After the solder and hot oil testing, microscopic examination revealed cracking of the copper deposit.

EXAMPLE III

Example II was repeated with the exception that plating was continued until a deposit of 1.4 mils was obtained. Again after testing, examination of the copper deposit revealed cracks, thus demonstrating that the results of Example II were not related to the thickness of the deposit.

EXAMPLE IV

Two multilayer circuit boards having 20 mil through-holes (aspect ratio 3:1) were identically prepared and additively plated as in Example I for 20 hours to a copper plating thickness of 1.3 mils, one board being plated using the vibratory device of Example I and the other board plated with just the mechanical back and forth movement of the rack. The boards were then dried, baked and subjected to the tests set forth in Example I, with the exception that, in order to determine at what stage cracking occurred, a portion of the board was cross-sectioned after every two cycles. After two cycles, through-holes sectioned from each board revealed no cracks. After four cycles, the through-hole from the non-vibrated board showed evidence of the beginning of a crack propagating from the shoulder of the hole, while the board plated with vibration showed no such cracking. After six cycles, the non-vibrated board showed complete cracking of the copper deposit, while the other board showed no cracking. Testing continued for the board plated with vibration until 20 cycles, at which point a crack was beginning to form.

As is known in the art, through-holes with aspect ratios of 3:1 are sufficiently large that, with routine bath agitation and gross mechanical back and forth movement of the substrate, solution flow through the hole and solution exchange with the hole are easily accomplished and not a limiting factor in attaining good electroless plating. Accordingly, the significantly improved results attained with the vibration of the invention are apparently not attributable simply to increased solution exchange.

As will be apparent from the foregoing description, the process of the present invention, although described with particular regard to the electroless copper plating which is of primary interest in the fabrication of printed circuit boards containing through-holes, also has applicability to the electroless plating of other metals, alloys or intermetallics, such as nickel, gold, and the like. So too, the vibrating process also can be applied with advantage to other processes in which substrates are immersed in solutions, including all the various surface preparation processes employed preparatory to electroless plating, including cleaning, conditioning, desmearing, etch-back, activation, acceleration, and the like, as well as post-electroless deposition processes, particularly where high aspect ratio through-holes are present.

The foregoing description, then, is presented to describe and illustrate the invention and its preferred embodiments, and is not to be taken as limiting the invention whose scope is defined in the appended claims.

What is claimed is:

1. In a method for the electroless deposition of metal onto the suitably activated surfaces of a substrate, wherein said substrate is immersed in contact with an electroless metal depositing bath for a time and at conditions effective to electrolessly deposit metal as a layer form said bath onto said activated substrate surfaces, the improvement comprising at least intermittently subjecting said substrate to vibrating in contact with said electroless depositing bath, said vibrating being at a vibration rate, of at least about 500 vibrations per minute, and carried out for a time, effective to provide on said activated substrate surfaces an electroless metal deposit having improved integrity as compared to an electroless metal deposit applied without said vibrating.

2. In a method for the electroless deposition of copper onto the suitably activated through-hole surfaces of a printed circuit board substrate containing through-holes, wherein said substrate is immersed in contact with an electroless copper depositing bath for a time and at conditions effective to electrolessly deposit copper as a layer from said bath onto said through-hole surfaces, the improvement comprising at least intermittently subjecting said substrate to vibrating in contact with said electroless copper depositing bath, said vibrating being at a vibration rate, of at least about 500 vibrations per minute, and carried out for at ime, effective to provide on said through-hole surfaces an electroless copper deposit having improved integrity as compared to an electroless copper deposit applied without said vibrating.

3. The method according to claim 2 wherein said through-holes have an aspect ratio of above about 3:1.

4. The method according to claim 2 wherein said through-holes have an aspect ratio of about 8:1 or greater.

5. The method according to any of claims 1 to 4 wherein said substrate is held in a racking device for immersion in contact with said electroless metal depositing bath, and wherein the subjecting of said substrate to vibrating comprises subjecting said rack to vibrating.

6. The method according to any of claims 1 to 4 wherein said substrate is held in a racking device, suspended over a carrier bar, for immersion in contact with said electroless depositing bath, and wherein the subjecting of said substrate to vibrating comprises subjecting said carrier bar to vibrating.

7. The method according to any of claims 1 to 4 wherein said vibrating is at a vibration rate of at least about 3500 vibrations per minute.

8. The method according to any of claims 1 to 4 wherein said vibrating is at an amplitude less than about 2 cm.

9. The method according to any of claims 1 to 4 wherein the at least intermittent subjecting of said substrate to vibrating is oonducted at substantially regular intervals of vibrating and non-vibrating during said electroless metal depositing.

10. In a method for the electroless deposition of copper onto the suitably activated through-hole surfaces of a printed circuit board substrate, wherein said substrate is held in a rack and immersed in contact with an electroless copper depositing bath for a time and at conditions effective to electrolessly deposit copper as a layer of at least about 1.0 mil thickness from said bath onto said through-hole surfaces, the improvement comprising at least intermittently subjecting said substrate to vibrating in contact with said electroless copper depositing bath at a vibration rate of at least about 3500 vibrations per minute.

11. An apparatus for electrolessly depositing metal from an electroless metal depositing bath onto the suitably activated surfaces of a substrate immersed in said electroless metal depositing bath, comprising a vessel adapted to hold said electroless metal depositing bath; racking means adapted to hold said substrate immersed in said electroless metal depositing bath in said vessel; and vibratory means for at least intermittently subjecting said substrate, while immersed in said electroless metal depositing bath, to vibrating at a rate of at least about 3500 vibrations per minute.

12. The apparatus according to claim 11 wherein said vibratory means subjects said racking means to vibrating for transmittal of said vibrating to said substrate.

* * * * *

REEXAMINATION CERTIFICATE (3390th)

United States Patent [19]
Kukanskis et al.

[11] B1 5,077,099
[45] Certificate Issued Dec. 2, 1997

[54] ELECTROLESS COPPER PLATING PROCESS AND APPARATUS

[75] Inventors: Peter E. Kukanskis, Woodbury; Edward T. Donlon, Bethlehem, both of Conn.

[73] Assignee: MacDermid, Incorporated, Waterbury, Conn.

Reexamination Request:
No. 90/003,373, Mar. 28, 1994

Reexamination Certificate for:
Patent No.: 5,077,099
Issued: Dec. 31, 1991
Appl. No.: 493,296
Filed: Mar. 14, 1990

[51] Int. Cl.⁶ ............................ C23C 26/00
[52] U.S. Cl. .............. 427/437; 427/438; 427/443.1; 427/347; 118/425
[58] Field of Search ................... 427/97, 98, 437, 427/443.1, 601

[56] References Cited

FOREIGN PATENT DOCUMENTS

| | | | |
|---|---|---|---|
| 54-18562 | 7/1979 | Japan | 427/601 |
| 62-154797 | 7/1987 | Japan . | |
| 62-154798 | 7/1987 | Japan . | |
| 62-238688 | 10/1987 | Japan | 427/98 |

*Primary Examiner*—Benjamin L. Utech

[57] ABSTRACT

An electroless metal plating process, particularly for use in plating through-holes in printed circuit substrates, and more particularly for additively depositing copper metal on through-hole surfaces, in which the substrate is at least intermittently subjected to vibrating motion in contact with the electroless depositing bath, and an electroless metal depositing apparatus for carrying out the process.

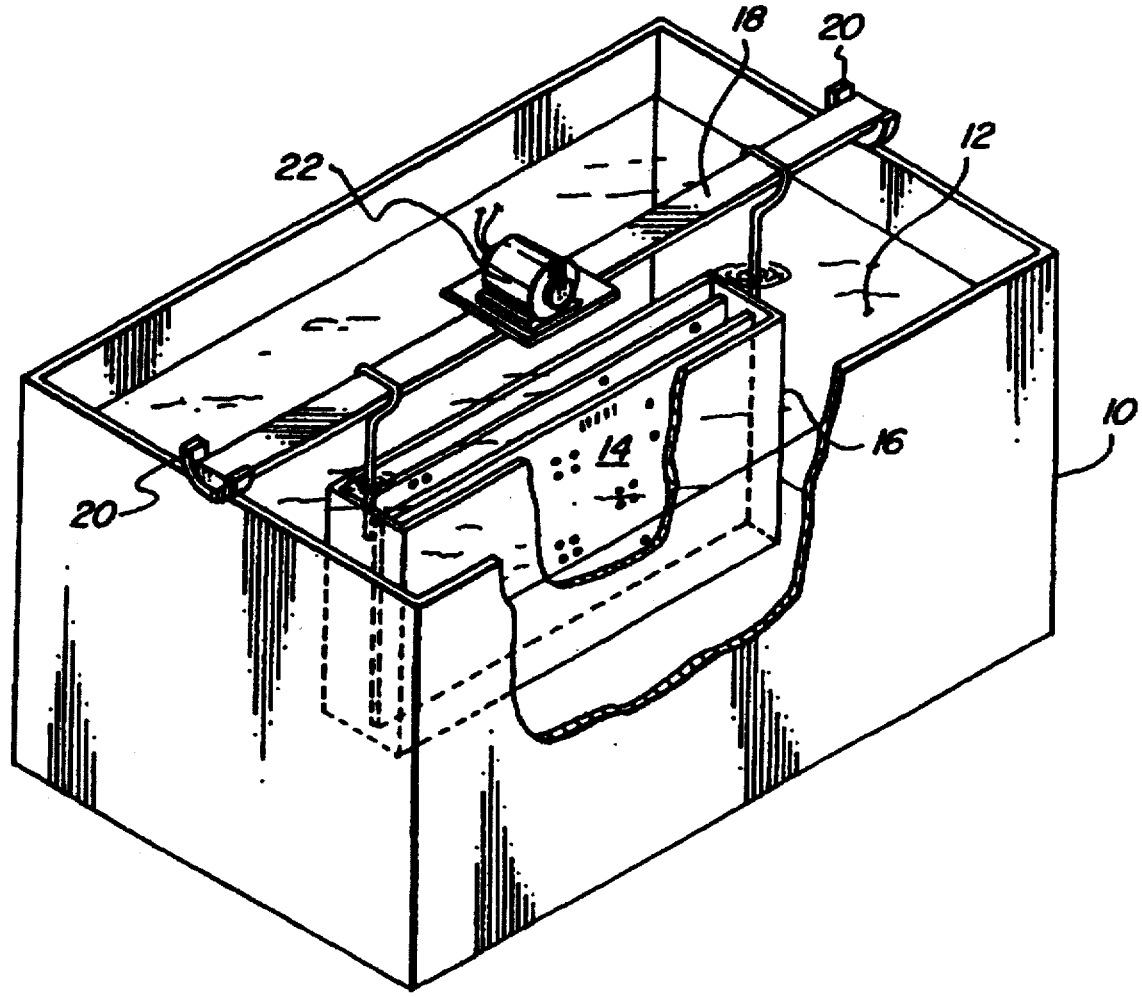

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–12 are cancelled.

* * * * *